United States Patent [19]

Petersen et al.

[11] Patent Number: 5,245,565
[45] Date of Patent: Sep. 14, 1993

[54] DIGITALLY PROGRAMMABLE LINEAR PHASE FILTER HAVING PHASE EQUALIZATION

[75] Inventors: Corey D. Petersen, Pleasanton; Douglas L. Hiser, Berkeley; Jaime E. Kardontchik, Sunnyvale, all of Calif.

[73] Assignee: International Microelectronic Products, San Jose, Calif.

[21] Appl. No.: 739,015

[22] Filed: Jul. 31, 1991

[51] Int. Cl.$^5$ .............................. G06G 7/02; G06F 15/31
[52] U.S. Cl. ............................ 364/825; 364/724.01
[58] Field of Search .................. 364/724.01, 724.16, 364/825; 375/11; 333/18, 28 R

[56] References Cited

U.S. PATENT DOCUMENTS

| | | | |
|---|---|---|---|
| 4,354,248 | 10/1982 | Conger et al. | 364/724.13 X |
| 4,799,112 | 1/1989 | Bremmer et al. | 360/31 |
| 4,945,311 | 7/1990 | Smith | 328/167 |
| 5,122,718 | 6/1992 | Sawata | 364/724.01 X |

OTHER PUBLICATIONS

Advance Information on SSI 32 F8010 Programmable Electronic Filter, *Silicon Systems*, Feb. 1990.
Tsutomu Wakimoto, et al. "A Low-Power Wide-Band Amplifier Using a New Parasitic Capacitance Compensation Technique," *IEEE Journal of Solid-State Circuits*, vol. 25, No. 1, Feb. 1990.
Howard C. Yang, et al. "An Active-Feedback Cascode Current Source," *IEEE Transactions on Circuits and Systems*, vol. 37, No. 5, May 1990.

*Primary Examiner*—Tan V. Mai
*Attorney, Agent, or Firm*—Majestic, Parsons, Siebert & Hsue

[57] ABSTRACT

A digitally programmable Bessel filter includes a plurality of serially connected stages or biquads with each biquad including a plurality of programmable operational transconductance amplifiers. The first stage of the filter provides an all pass equal amplitude response. Two stages provide pulse slimming (first and second derivatives of an input pulse), and three stages provides a sixth order Bessel low pass function. The operational transconductance amplifiers are controlled by a fine tuning control signal, and an array of integrating capacitors are selectively controlled by a coarse tuning signal. The fine tuning and coarse tuning signals are generated in a phase locked loop from a reference clock and a reference biquad which receives the reference clock.

10 Claims, 9 Drawing Sheets

$$\left[ \frac{s^2 - s\frac{\omega_{ap}}{Q_{ap}} + \omega_{ap}^2}{s^2 + s\frac{\omega_{ap}}{Q_{ap}} + \omega_{ap}^2} \right] \left[ \frac{\omega_{p1}^2(1+\frac{s}{\omega_{za}})}{s^2 + s\frac{\omega_{p1}}{Q_{p1}} + \omega_{p1}^2} \right] \left[ \frac{\omega_{p2}^2(1-\frac{s}{\omega_{zb}})}{s^2 + s\frac{\omega_{p2}}{Q_{p2}} + \omega_{p2}^2} \right] \left[ \frac{\omega_{p3}^2}{s^2 + s\frac{\omega_{p3}}{Q_{p3}} + \omega_{p3}^2} \right]$$

FIG. 3A
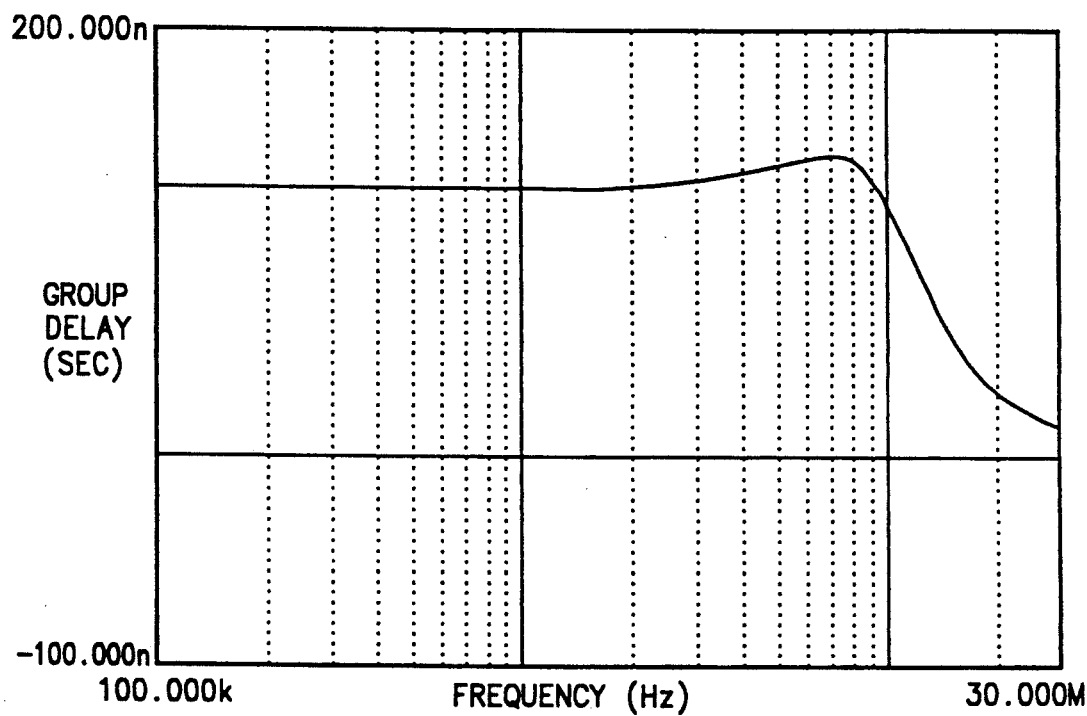
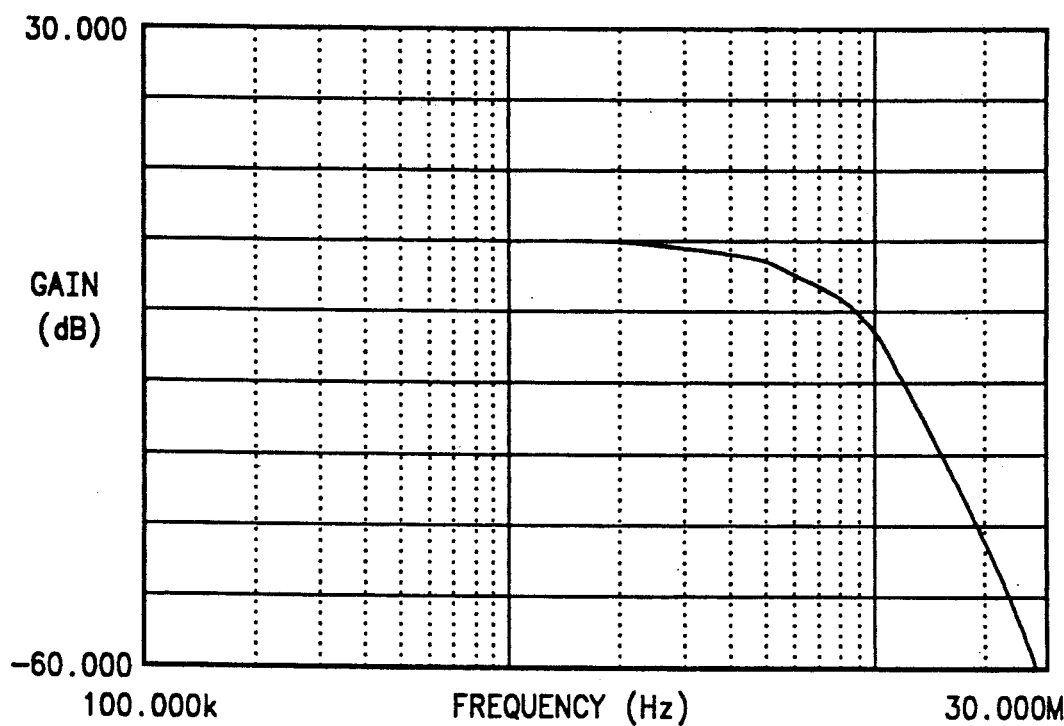
FIG. 3B

DIGITALLY PROGRAMMABLE LINEAR PHASE FILTER HAVING PHASE EQUALIZATION

BACKGROUND OF THE INVENTION

This invention relates generally to electrical filters and more particularly the invention relates to a linear phase filter using programmable operational transconductance amplifiers.

In recovering signals stored optically or magnetically on a tape or disk, pulse shaping and filtering circuitry is required. The conventional filter for reading magnetically stored data, such as stored on tape or disk, is built with passive discrete components in a circuit which is designed for implementing only one particular phase-/amplitude response and therefore for only one type of pick up head. The performance of the read channel is measured to the bit error rate and since the conventional read channel filter has a fixed response, any given filter contributes to lower the bit error rate for a particular head type only. Passive components typically used in such filters are analog devices which cannot be readily altered. However, an analog programmable seven pole Bessel type low pass filter is currently available from Silicon Systems, Tustin, Calif.

SUMMARY OF THE INVENTION

An object of the present invention is an improved digitally programmable filter for reading and shaping stored signals.

Another object of the invention is an improved low pass linear phase filter having pulse shaping.

Still another object of the invention is a digitally programmable filter including a plurality of biquads comprised of operational transconductance amplifiers.

Another object of the invention is the use of a phase locked loop in providing fine and course tuning of a filter.

A feature of the invention is an asymmetrical pulse slimmer and a second order all pass stage and a sixth order linear phase low pass filter.

Another feature of the invention is the use of CMOS amplifiers in the operational transconductance amplifiers of the digitally programmable filter.

Yet another feature of the invention is a digitally programmable filter which lends itself to 16 pin SOIC and DIP packages.

Briefly, a filter in accordance with one embodiment of the invention includes an all pass, phase equalization stage serially connected with a linear phase (Bessel) low pass filter comprising a plurality of biquads. Biquads of the low pass filter also function as a pulse slimmer in mixing portions of the input signal, the first derivative of the input signal, and the second derivative of the input signal.

Each biquad comprises a plurality of operational transconductance amplifiers (OTA) in which the transconductance (gm) is readily programmed for fine tuning. Coarse tuning is effected by control of the integrating capacitor connected to the output of one or more OTA's.

Control of the stages of the filter is with a phase lock loop including a phase detector which responds to a reference clock and the output of a reference biquad which receives the reference clock as an input. The reference biquad assures accuracy over process and environmental conditions. The output of the phase detector is integrated and compared to preestablished minimum and maximum voltage levels to establish a coarse frequency control signal. A fine frequency control signal is provided by converting the integrated phase detector output to a current which controls the transconductance of the OTA's.

The invention and objects and features thereof will be more readily apparent from the following detailed description and appended claims when taken with the drawings.

BRIEF DESCRIPTION OF THE DRAWING

FIGS. 3A, 3B and 3C are plots illustrating frequency characteristics of the filter of FIG. 1A.

DETAILED DESCRIPTION OF ILLUSTRATIVE EMBODIMENTS

Figures 1A, 1B:
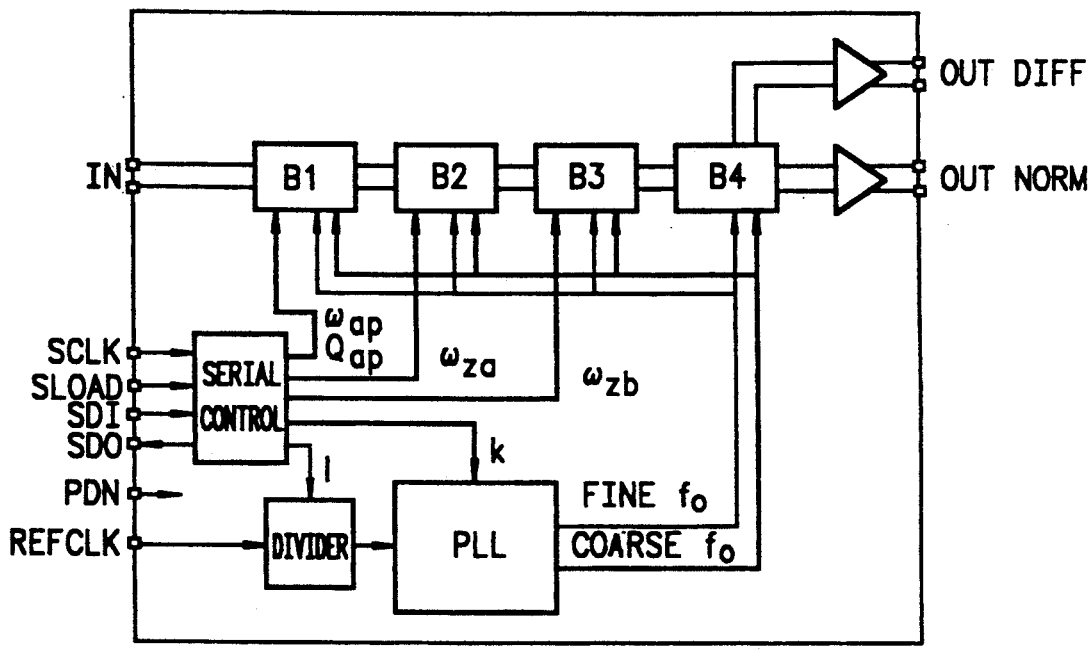
FIG. 1A is a block diagram of a digitally programmable filter in accordance with the invention.
FIG. 1B is pin diagram of the filter of FIG. 1 in a 16 pin dual in-line package.

Referring now to the drawing, FIG. 1A is a functional block diagram of a digitally programmable filter in accordance with one embodiment of the invention, and FIG. 1B illustrates the pin diagram for the filter in a 16 pin dual in-line package (DIP). As noted in FIG. 1B, the packaged filter includes double ended inputs, INN and INP, which are normally taken from the double ended outputs of an automatic gain control (AGC) amplifier. A pair of normal double ended outputs is provided, OUT NORM N and OUT NORM P, and a pair of differentiated double ended outputs is provided OUT DIF P and OUT DIF N. VDD and VSS are digital power pins, and four serial interface pins (SCLK, SDI, SDO, and SLOAD) are provided for programming the filter. A reference clock, REF CLK, is provided for tuning the filter, and a power down input (PDN) is used to retain a set of programmed values in the filter register set when in power down mode. AVSS is analog ground and AVDD is the analog positive supply. Further description of the use of the pins will be given herein below.

As seen in the block diagram of FIG. 1A, the filter includes four stages, B1—B4, the serial control, and a divider which connects the reference clock to the phase locked loop (PLL). The PLL provides fine tuning and coarse tuning to the four stages of the amplifier.

Figures 2A, 2B:
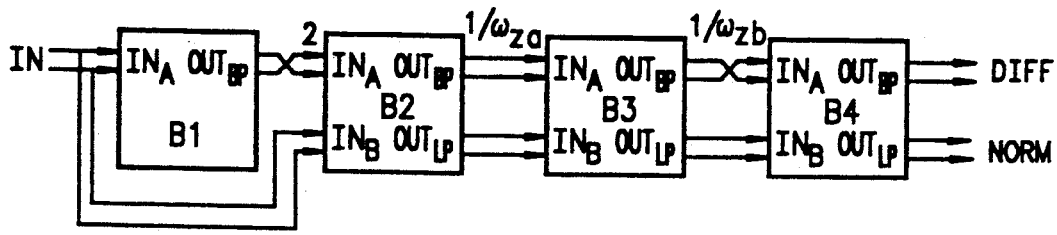
FIG. 2A is a diagram illustrating four stages of a digitally programmable filter in accordance with a preferred embodiment.
FIG. 2B is an equation representing the transfer function/of the filter of FIG. 2A.

FIG. 2A further illustrates the interconnection of the four stages of the amplifier, and FIG. 2B illustrate the transfer characteristics of the four stages. The first stage B1 is a second order all pass filter, and the other three stages (B2, B3, B4) provide a sixth order Bessel low pass filter. Additionally, stages B2 and B3 provide a pulse slimmer function as shown in the numerators of the transfer functions therefor.

The all pass section, B1, passes all frequencies with equal amplitude response. However, the phase response of the all pass section is useful for correcting phase distortions introduced by various pick-up heads and media. FIG. 3A shows the phase response of the filter with the all pass section B1 programmed with $\omega_{AP}=2$ $\omega_c$ (cutoff frequency) and $Z=0.8$.

The sixth order Bessel low pass filter function is provided by the stages B2, B3, B4. The low pass coefficients are fixed to define the Bessel function, however the cutoff frequency of the filter can be varied via the external clock, thus allowing the amplitude and phase responses of the filter to be moved along the frequency axis. FIG. 3B shows the response of the filter with a cutoff frequency set at 5 MHz with the all pass and pulse slimming sections disabled.

Figure 3C:
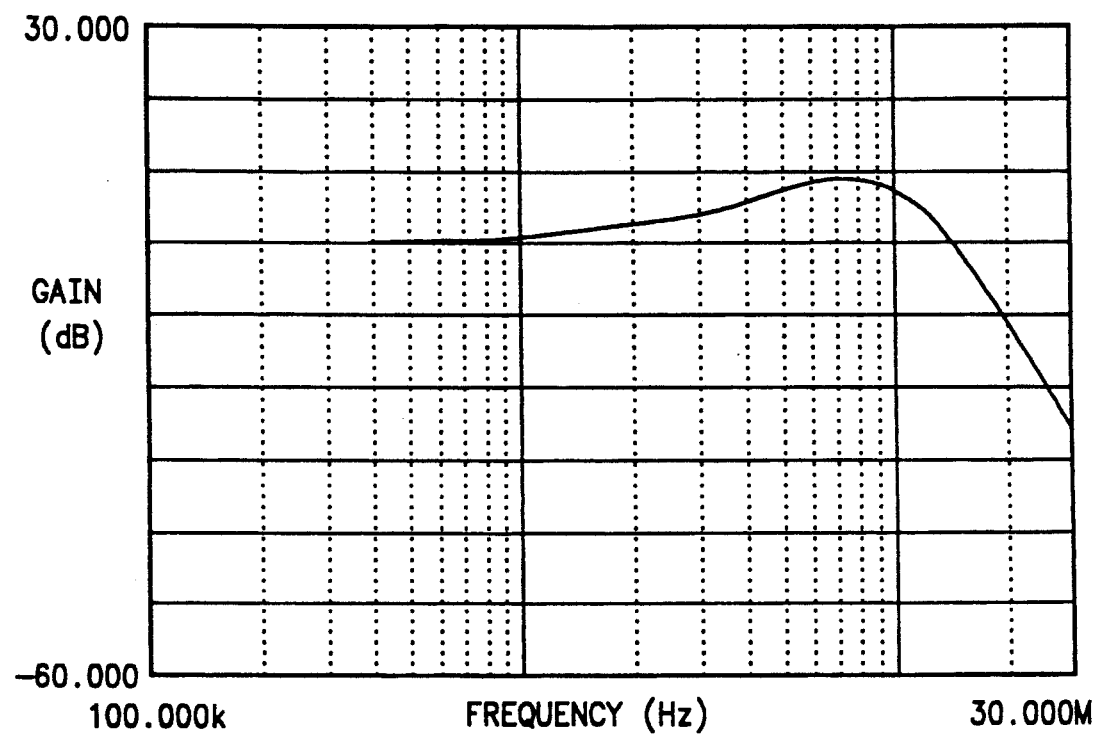

The pulse slimmer function is provided by stages B2, B3. Both symmetrical and asymmetrical pulse slimming capability is offered. Generally, pulse slimming is used to counteract the imperfections in the pulses emerging from the magnetic head. Due to issues such as the finite thickness of the read head, pulses generally have a delayed trailing edge. This delay causes the fattening of the pulse, and subsequently a loss of the resolution in the media. The pulse slimmer acts to pass three components of the input signal, at relative strengths, programmable by the user. The three components are the signal from the magnetic head, the first derivative, and the second derivative. The transfer function of the pulse slimmer is shown in the numerator for the sections B2, B3. By varying the coefficients in the transfer function, different results can be obtained. The all pass and pulse slimmer frequency responses track the reference frequency supplied to the phase lock loop. FIG. 3C shows how the filter response will be modified by choosing slimmer frequencies of 3.5 MHz at a cutoff frequency of 5 MHz.

Figure 4:
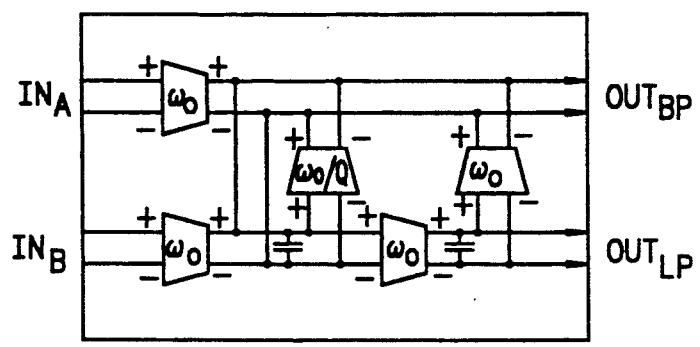
FIG. 4 is a schematic of a biquad in the filter of FIG. 2A.
Figure 5:
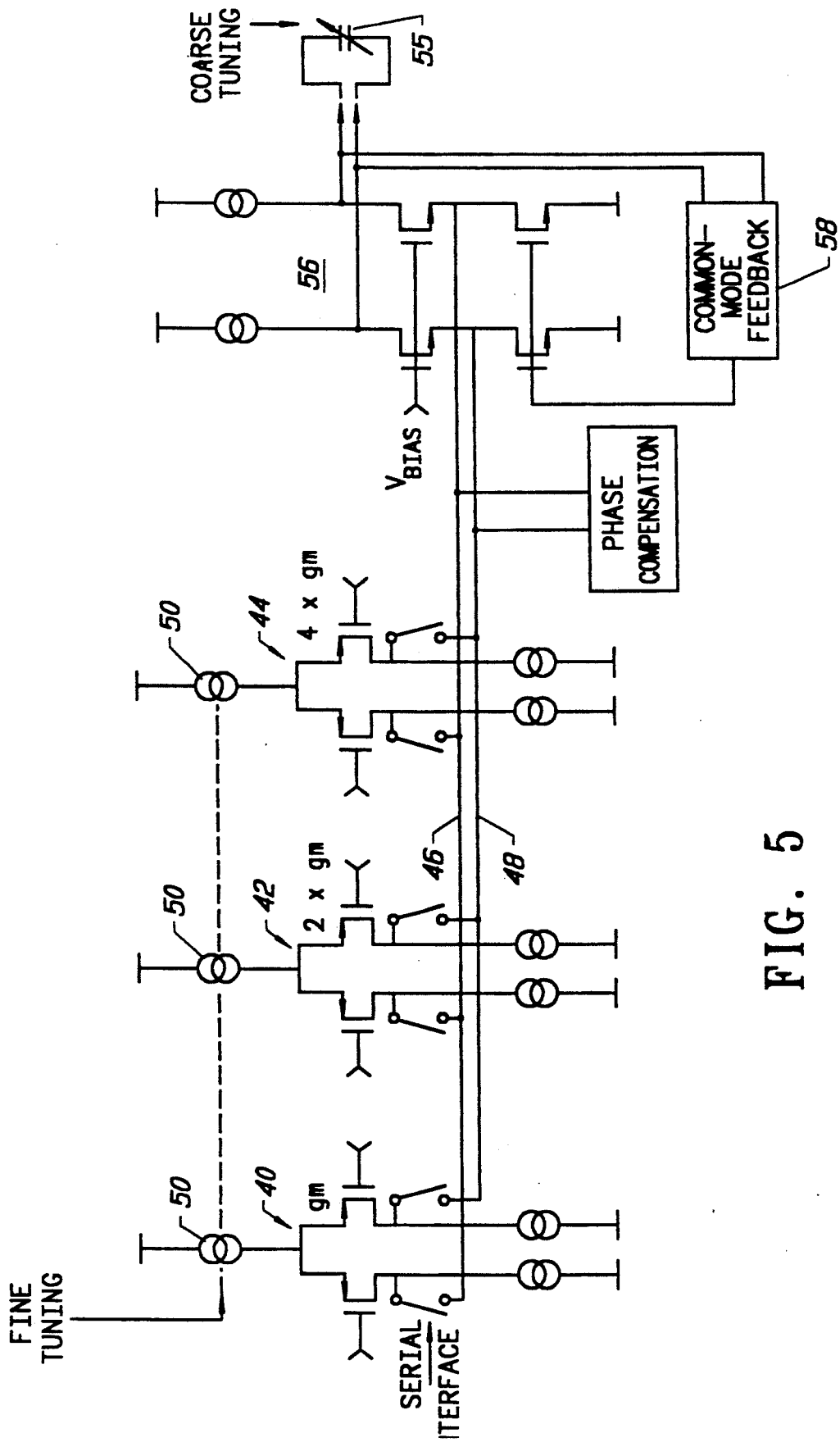
FIG. 5 is a schematic of a programmable OTA used in the biquad of FIG. 4.

FIG. 4 is a more detailed functional block diagram of each stage of the filter. The biquad comprises five operational transconductance amplifiers (OTA) and two integrating capacitors as shown. FIG. 5 is a more detailed schematic of a three bit programmable OTA in which three transconductance amplifiers 40, 42, and 44 are connected in parallel to lines 46 and 48. Each of the amplifiers provides output current to the lines 46, 48 in response to input voltages. Fine tuning of the amplifiers is provided by varying the current from current sources 50 in each of the amplifiers. By selectively interconnecting the amplifiers to the lines 46, 48 and by varying the fine tuning, the transconductance of the OTA is established. The currents in the output lines 46, 48 are applied to the integrating capacitor 55 through output stage 56. Capacitor 55 comprises an array of capacitive elements which can be selectively altered to effect coarse tuning of the OTA. Standard common mode feedback 58 is provided in stage 56, and phase compensation is provided in the lines 46, 48.

Figure 6:
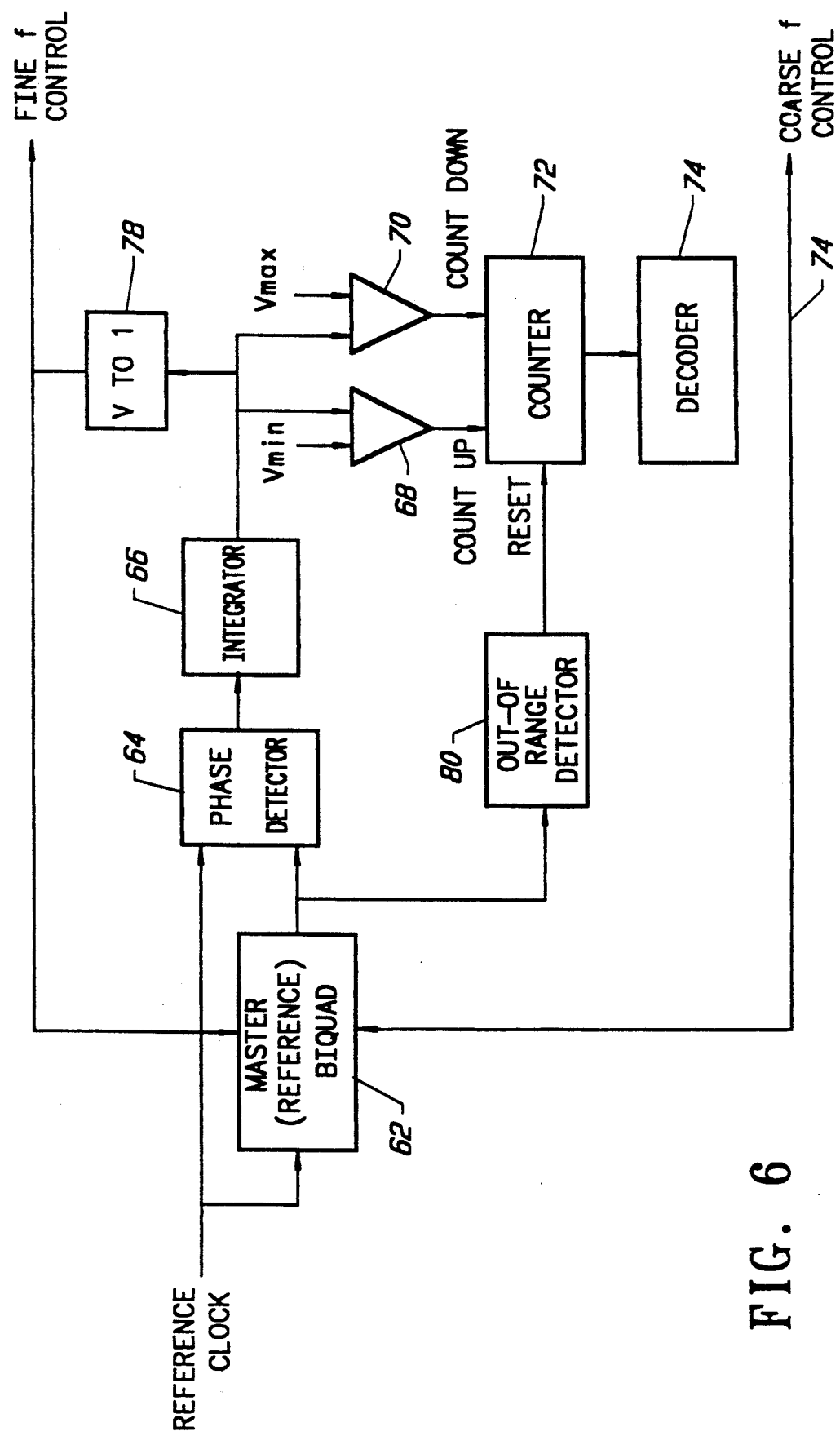
FIG. 6 is a functional block diagram of a phase locked loop used in the filter of FIG. 1.

FIG. 6 is a block diagram of the phase locked loop. The cutoff frequency of the filter is nominally set at ⅓ of the incoming reference clock, however scaling of the cutoff frequency relative to the reference clock is programmable. A reference biquad is employed in providing the reference clock to one input of a phase detector, and the output of the phase detector is applied to an integrator which supplies a voltage to VMIN and VMAX comparators. The outputs of the comparators then control the count up and count down of a counter 72. The output of the counter 72 is applied to a decoder 74 to facilitate the generation of a coarse frequency control signal on line 76. A fine frequency control signal is generated by converting the output of integrator 66 to a current in converter 78. An out of range detector 80 connects the reference clock signal passed through reference biquad 62 to counter 72 as a reset when the phase detector 64 is out of range.

Figure 7A:
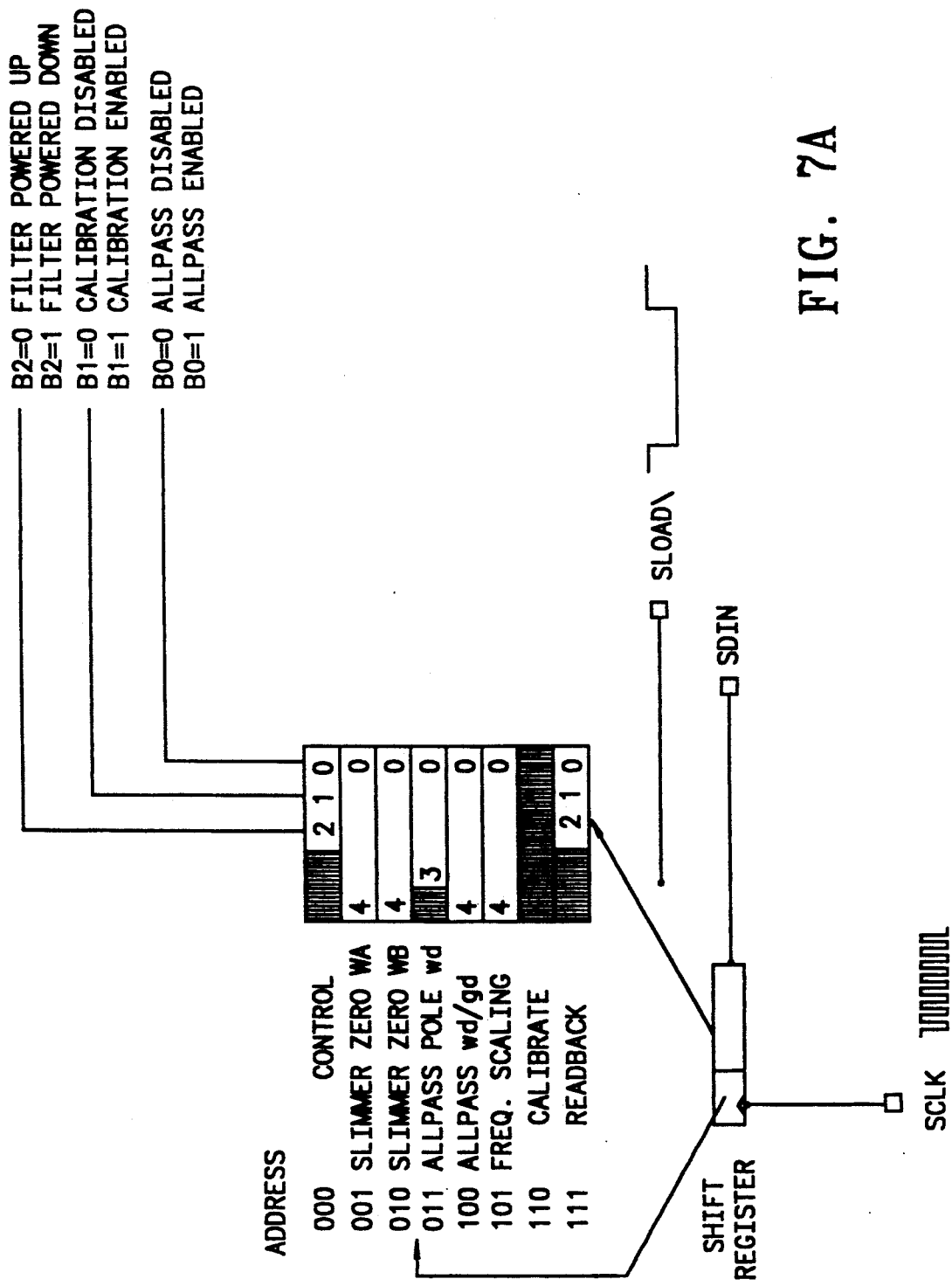
FIG. 7A and 7B are diagrams illustrating the programming of the filter of FIG. 1.
Figure 7B:
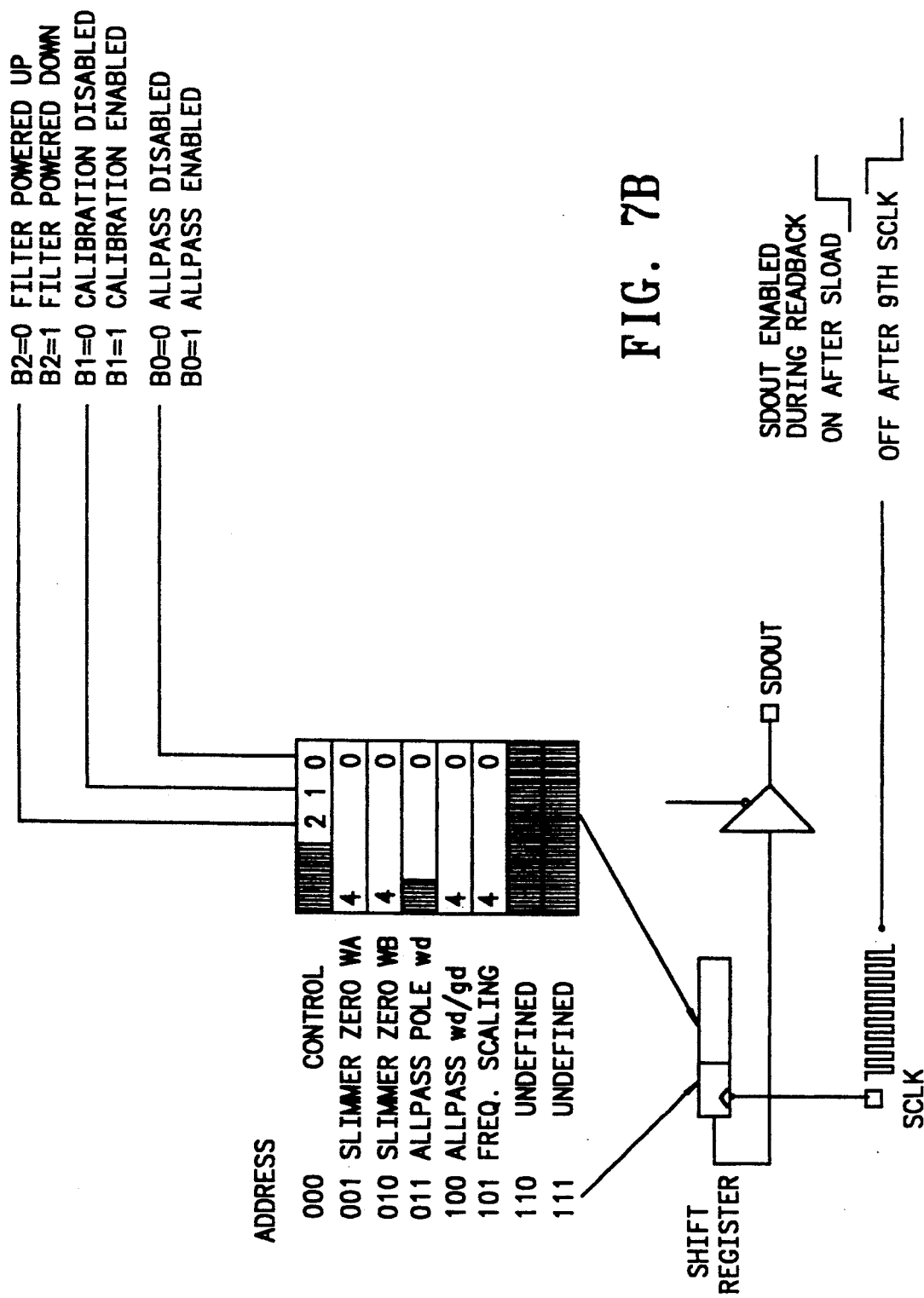
Figure 8:
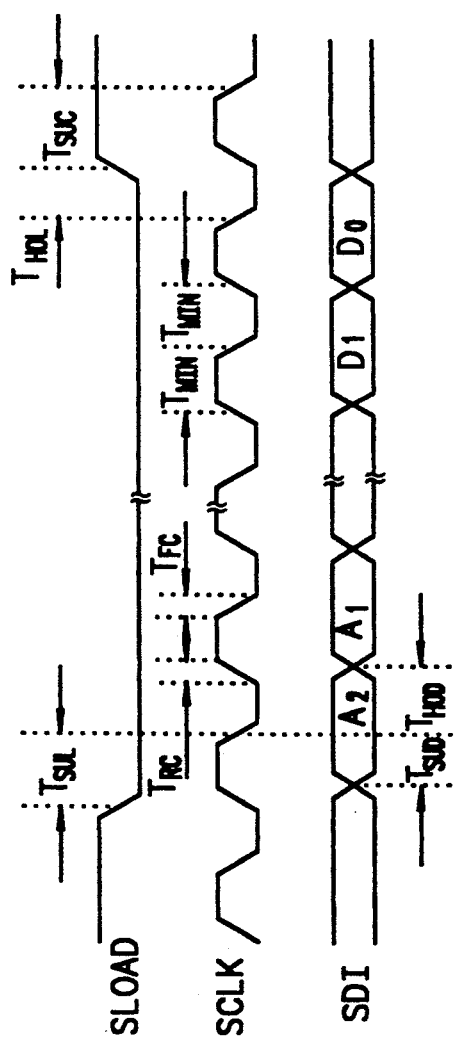
FIG. 8. is a timing diagram in programming filter coefficients.

The serial interface pins (SCLK, SDIN, SDOUT, and SLOAD) allow read/write access to a set to eight register locations. A three bit address field selects the register, which may contain up to five bits of data. The address and data are formatted into an eight bit packet which is transmitted over the serial interface to the biquads of the filter. Operation of the serial interface is illustrated in FIGS. 7A and 7B.

Two types of operation can be carried out via the serial interface, data write and data feedback.

Data write sends an eight bit packet to the filter via the SDATA line. This eight bit packet consists of a three bit address, which selects one of eight destinations on the filter, and one to five bits of data. All packets are eight bits in length, even if the data field is less than five bits. All data fields less than five bits are shifted to the least significant end of the packet. Each data write operation takes eight clock cycles to complete. Contents of the internal registers may be read back. A register is selected by placing the address of the register to be read in the data field.

A simple three input serial interface is provided to program the filter coefficients. Data is shifted in eight bit sequences. The three bit address (MSB first) is shifted in first followed by five bits of data (MSB first). There are eight internal register addresses. Data is clocked in on the falling edge of SCLK. Data is loaded into two internal registers on the rising edge of SLOAD. During read back, eight bits of data are shifted out the SDO pin on the falling edge of SCLK. Upon receiving a ninth clock pulse, the SDO output will go high impedance.

The timing diagram is given is FIG. 7 and the following table provides input timing specifications:

| PARAMETER | CONDITIONS | MIN | MAX | UNITS |
|---|---|---|---|---|
| Tsul | SLOAD setup time to SCLK | 50 | | nS |
| Thol | SLOAD hold time after SCLK | 50 | | nS |
| Trc | SCLK rise time | | 10 | nS |
| Tfc | SCLK fall time | | 10 | nS |
| Tmin | SCLK high time and low time | 100 | | nS |
| Tsud | SDI setup time to SCLK | 50 | | nS |
| Thod | SDI hold time after SCLK | 50 | | nS |
| Tsuc | SLOAD high to SCLK falling edge | 50 | | nS |
| Tlmin | SLOAD high time | | 100 | nS |

There has been described a programmable sixth order Bessel low pass filter with a programmable second order all pass stage. The filter provides precise tracking using external reference frequency and a closed loop PLL tuning. The filter is ideal for hard disk drive read channels using constant density recording formats, but the filter can be applicable in other applications including optical memories. Importantly, no external components are required.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A digitally programmable continuous time filter comprising a plurality of serially connected filter stages, a first filter stage having a second order all pass frequency response, at least two other stages providing pulse slimming and a linear phase low pass filter response, and means connected to said plurality of stages for controlling the responses of said stages.

2. The digitally programmable filter as defined by claim 1 wherein said linear phase is a sixth order Bessel function.

3. The digitally programmable filter as defined by claim 1 wherein each stage comprises a biquad, each biquad comprising a plurality of programmable operational transconductance amplifiers and a plurality of integrating capacitors.

4. The digitally programmable filter as defined by claim 3 wherein each programmable operational transconductance amplifier includes a plurality of transistor pairs switchably connected to two current lines, each transistor pair being serially connected with a controllable current source, whereby the transconductance of each programmable operational transconductance amplifier is controlled by the selective interconnection of said transistor pairs and the control of each controllable current source.

5. The digitally programmable filter as defined by claim 4 and further including a phase locked loop, said phase locked loop including a phase detector, a reference biquad, an integrator, means for generating a fine control signal, and means for providing a coarse control signal, means for providing a reference clock to a first input of said phase detector and of said reference biquad, means connecting an output of said reference biquad to a second input to said phase detector, said phase detector generating a current in response to phase comparison of said first and second inputs, said integrator receiving and integrating said current from said phase detector and providing a voltage output, said means for generating a fine control signal and said means for providing a coarse control signal being responsive to said voltage output from said integrator.

6. The digitally programmable filter as defined by claim 5 wherein said means for generating a fine control signal and said means for generating a coarse control signal provide control signals to said reference biquad and to all programmable transconductance amplifiers in said plurality of serially connected filter stages.

7. The digitally programmable filter as defined by claim 6 wherein said fine control signal is applied to control each of said controllable current sources, each of said integrating capacitors comprising a capacitor array with said coarse control signal controlling said capacitor array.

8. The digitally programmable filter as defined by claim 7 wherein said filter has the following transfer characteristic:

$$\frac{s^2 - s\frac{\omega_{ap}}{Q_{ap}} + \omega_{ap}^2}{s^2 + s\frac{\omega_{ap}}{Q_{ap}} + \omega_{ap}^2} \cdot \frac{\omega_{p1}^2\left(1 + \frac{s}{\omega_{za}}\right)}{s^2 + s\frac{\omega_{p1}}{Q_{p1}} + \omega_{p1}^2} \cdot$$

$$\frac{\omega_{p2}^2\left(1 - \frac{s}{\omega_{zb}}\right)}{s^2 + s\frac{\omega_{p2}}{Q_{p2}} + \omega_{p2}^2} \cdot \frac{\omega_{p3}^2}{s^2 + s\frac{\omega_{p3}}{Q_{p3}} + \omega_{p3}^2}$$

where $\omega ZA$, $\omega ZB$, $\omega AP$, $QAP$, $\omega P1$, $\omega P2$, $\omega P3$, $QP1$, $QP2$, $QP3$ are programmed constants.

9. The diqitally programmable filter as defined by claim 1 wherein said filter has the following transfer characteristic:

$$\frac{s^2 - s\frac{\omega_{ap}}{Q_{ap}} + \omega_{ap}^2}{s^2 + s\frac{\omega_{ap}}{Q_{ap}} + \omega_{ap}^2} \cdot \frac{\omega_{p1}^2\left(1 + \frac{s}{\omega_{za}}\right)}{s^2 + s\frac{\omega_{p1}}{Q_{p1}} + \omega_{p1}^2} \cdot$$

$$\frac{\omega_{p2}^2\left(1 - \frac{s}{\omega_{zb}}\right)}{s^2 + s\frac{\omega_{p2}}{Q_{p2}} + \omega_{p2}^2} \cdot \frac{\omega_{p3}^2}{s^2 + s\frac{\omega_{p3}}{Q_{p3}} + \omega_{p3}^2}$$

where $\omega ZA$, $\omega ZB$, $\omega AP$, $QAP$, $\omega P1$, $\omega P2$, $\omega P3$, $QP1$, $QP2$, $QP3$ are constants programmed relative to a reference frequency.

10. The digitally programmable filter as defined by claim 9 wherein a differentiated output is provided which is proportional to said transfer function multiplied by s.

* * * * *

UNITED STATES PATENT AND TRADEMARK OFFICE
CERTIFICATE OF CORRECTION

PATENT NO. : 5,245,565
DATED : September 14, 1993
INVENTOR(S) : Petersen et al.

It is certified that error appears in the above-indentified patent and that said Letters Patent is hereby corrected as shown below:

Column 6, line 28, in Claim 8:  Replace "oonstants" with --constants--

Column 6, line 29, in Claim 9:  Replace "diqitally" with --digitally--

Signed and Sealed this

Twenty-ninth Day of March, 1994

Attest:

BRUCE LEHMAN

*Attesting Officer*  *Commissioner of Patents and Trademarks*